(12) United States Patent
Choi et al.

(10) Patent No.: US 9,321,633 B2
(45) Date of Patent: Apr. 26, 2016

(54) PROCESS FOR PRODUCING 3-DIMENSIONAL STRUCTURE ASSEMBLED FROM NANOPARTICLES

(71) Applicants: SNU R&DB Foundation, Seoul (KR); Global Frontier Center for Multiscale Energy Systems, Seoul (KR)

(72) Inventors: Hoseop Choi, Seoul (KR); Man Soo Choi, Seoul (KR)

(73) Assignees: Global Frontier Center for Multiscale Energy Systems, Seoul (KR); SNU R&DB Foundation, Seoul (KR)

( * ) Notice: Subject to any disclaimer, the term of this patent is extended or adjusted under 35 U.S.C. 154(b) by 3 days.

(21) Appl. No.: 14/233,011

(22) PCT Filed: Mar. 4, 2013

(86) PCT No.: PCT/KR2013/001702
§ 371 (c)(1),
(2) Date: Jan. 15, 2014

(87) PCT Pub. No.: WO2014/010808
PCT Pub. Date: Jan. 16, 2014

(65) Prior Publication Data
US 2014/0212641 A1     Jul. 31, 2014

(30) Foreign Application Priority Data
Jul. 13, 2012 (KR) .................. 10-2012-0076891

(51) Int. Cl.
*B81C 1/00* (2006.01)

(52) U.S. Cl.
CPC ......... *B81C 1/00373* (2013.01); *B81C 1/00031* (2013.01); *B81C 2201/0187* (2013.01); *Y10T 428/24893* (2015.01)

(58) Field of Classification Search
CPC .................. B81C 1/00031; B81C 2201/0187; B81C 1/00373
USPC .......................................... 427/468
See application file for complete search history.

(56) References Cited

U.S. PATENT DOCUMENTS

| | | | |
|---|---|---|---|
| 2002/0050061 A1* | 5/2002 | Komyoji et al. | ............... 29/846 |
| 2005/0237834 A1 | 10/2005 | Bozano et al. | |
| 2007/0101823 A1 | 5/2007 | Sen et al. | |

FOREIGN PATENT DOCUMENTS

| | | |
|---|---|---|
| JP | 2004-207562 | 7/2004 |
| JP | 2008-080461 | 4/2008 |

(Continued)

OTHER PUBLICATIONS

Messing et al. "Generation of Pd Model Catalyst Nanoparticles by Spark Discharge," J Phys Chem C 114:9257-9263 (2010).

(Continued)

*Primary Examiner* — Xiao Zhao
(74) *Attorney, Agent, or Firm* — Dardi & Herbert, PLLC; Peter S. Dardi

(57) ABSTRACT

The present invention relates to a process for producing a 3-dimensional structure assembled from nanoparticles by using a mask having a pattern of perforations, which comprises the steps of: in a grounded reactor, placing a mask having a pattern of perforations corresponding to a determined pattern at a certain distance above a substrate to be patterned, and then applying voltage to the substrate to form an electrodynamic focusing lens; and introducing charged nanoparticles into the reactor, the charged particles being guided to the substrate through the pattern of perforations so as to be selectively attached to the substrate with 3-dimensional shape. According to the process of the present invention, a 3-dimensional structure of various shapes can be produced without producing noise pattern, with high accuracy and high efficiency.

7 Claims, 15 Drawing Sheets

(56) References Cited

FOREIGN PATENT DOCUMENTS

| KR | 10-2006-0042144 A | 5/2006 |
|---|---|---|
| KR | 10-2008-0051754 A | 6/2006 |
| KR | 10-0740984 B1 | 7/2007 |
| KR | 10-2008-0010663 A | 1/2008 |
| KR | 10-2008-0104947 A | 3/2008 |
| KR | 10-0907787 B1 | 7/2009 |
| KR | 10-2009-0089787 A | 8/2009 |
| KR | 10-2009-0132488 A | 12/2009 |
| KR | 10-2010-0068777 A | 6/2010 |
| KR | 10-2010-0105023 A | 9/2010 |
| KR | 10-2010-0138089 A | 12/2010 |
| KR | 10-1109195 B1 | 1/2012 |
| KR | 10-2012-0038472 A | 4/2012 |
| WO | 2005/115088 A2 | 12/2005 |

OTHER PUBLICATIONS

Tabrizi et al., "Generation of nanoparticles by spark discharge," J Nanopart Res 11:315-332 (2009).

Vons et al., "Silicon nanoparticles produced by spark discharge," J Nanopart Res 13:4867-4879 (2011).

Search Report for International Application No. PCT/KR2013/001702, mailed Apr. 30, 2013.

* cited by examiner (Scale bar: 5µm)

PROCESS FOR PRODUCING 3-DIMENSIONAL STRUCTURE ASSEMBLED FROM NANOPARTICLES

CROSS REFERENCE TO RELATED APPLICATIONS

This application is a national stage filing of PCT application number PCT/KR2013/001702 filed on Mar. 4, 2013, which claims priority to Korean Patent Application Number 10-2012-0076891 filed Jul. 13, 2012, both of which are hereby incorporated herein by reference.

FIELD OF THE INVENTION

The present invention relates to a process for focused patterning a 3-dimensional structure by using a mask having a pattern of perforations, without producing noise pattern, with high accuracy and high efficiency.

BACKGROUND OF THE INVENTION

A patterning technology producing a micro- or nano-sized 3-dimensional structure in a desired position by selectively controlling charged particles plays an important role in developing materials having new physical and chemical characteristics.

Particularly, producing a 3-dimensional nanostructure by improving focusing effect is expected to be useful in terms of producing future optical, electrical or magnetic devices.

For patterning charged particles, in the beginning, patterning, i.e., position controlling and attaching, of the particles was conducted by forming a dielectric film on a conductive or nonconductive support, and transferring an electric charge on the dielectric film by using a process such as electron beam or ion beam focusing (SEM or FIB), an atomic force microscope (AFM), micro-contact printing and the like.

According to study results released since 2003, a method for electrofocusing deposition of charged particles in a desired pattern position including the steps of forming a photo-resistor on a support; patterning the formed photo-resistor; and implanting charged particles while controlling charges on the photo-resistor surface by using electrical field formation and ion charge implantation, has been introduced.

However, in the case of forming a photo-resistor on a support as described above, there are inconveniences that the photo-resistor cannot be reused and photo-resistor patterning should be conducted several times to form a 3-dimensional structure system. Further, it is not suitable as a future technology of nano-sized or atomic level patterning because it is difficult to control the surface ion charges.

On the other hand, in the case of vacuum deposition, a metal mask having a pattern of perforations can be used, and in this case, there are problems that it is difficult to produce a nano-sized pattern and material loss resulting from mask contamination is very big when the aspect ratio is high. Further, in the case of electron beam photolithography (EPL), although a nano-sized pattern can be produced, the pattern size may be irregularly reduced due to the material attached (contaminated) to the mask surface.

Accordingly, in Korean Patent Registration No. 10-0907787, the present inventors suggested a method for focused patterning of charged particles comprising the steps of placing a mask having a pattern of perforations on a substrate and guiding charged particles to the substrate through the perforations, followed by focused deposition of the particles on the substrate (see FIG. 1). As shown in FIG. 1, equipotential lines (9) and electric field lines (10) are formed by applying voltage between two electrode layers (5), (6) in a grounded reactor (metal chamber) (30). Charged particles (1) move along the electric field lines (10) by electrical force and then migrate to a substrate (3). A pattern structure (4) on the substrate (3) is formed by focusing the charged particles (1) passing through a nonconductive plate or film (2) by an electrodynamic lens. However, only 2-dimensional patterns can be formed by this method.

Thus, the present inventors have further studied a more efficient method for producing a nanoparticle assembly structure having 3-dimensional shape.

PRIOR ART DOCUMENT

Patent Document (Patent Document 1) Korean Patent Registration No. 10-0907787

SUMMARY OF THE INVENTION

Accordingly, the present invention provides a method for focused patterning a 3-dimensional structure assembled from nanoparticles without producing noise pattern, with high accuracy and high efficiency.

In order to accomplish one object of the present invention, the present invention provides a process for producing a 3-dimensional structure assembled from nanoparticles comprising the steps of:

(i) in a grounded reactor, placing a mask having a pattern of perforations corresponding to a determined pattern at a certain distance above a substrate to be patterned, and then applying voltage to the substrate to form an electrodynamic focusing lens; and (ii) by introducing charged nanoparticles into the reactor, guiding the charged particles to the substrate through the pattern of perforations so that the particles can be selectively attached to the substrate with 3-dimensional shape.

According to one preferred embodiment of the present invention, the process may further comprise a step of accumulating ion layer by introducing charged gas ions, which are charged with the same polarity as that of charged nanoparticles, onto the mask surface in step (ii).

According to another preferred embodiment of the present invention, in the step of accumulating ions, a voltage in a range of 0.01~10 kV, having opposite polarity to the charged particles may be applied to the substrate; and in the step of depositing the nanoparticles in step (ii), a voltage in a range of 0.01~10 kV, having opposite polarity to the charged particles may also be applied to the substrate.

In the process of the present invention, the ratio of the width (w) of the perforations in the mask and the distance (d) between the substrate and the mask may be preferably in the range of 1:0.01~10.

In the process of the present invention, in step (ii), the shape of 3-dimensional structures may be transformed by changing focusing level of the charged particles through controlling the charge or voltage by using a voltage and current supplying device, a battery or a storage battery.

According to another preferred embodiment of the present invention, step (ii) may comprise a first deposition at a first voltage and a second deposition at a second voltage, wherein the first voltage and the second voltage may be in the range of 0.01~10 kV having the opposite polarity to the charged particles, and the voltage intensities may be different from each other.

Further, according to another preferred embodiment, in the step of guiding the charged nanoparticles to the substrate through the pattern of perforations, the 3-dimensional structure formed by focused attachment of the charged nanoparticles is produced by focusing the charged nanoparticles while moving the mask or the substrate in a direction parallel or perpendicular to each other.

Advantageous Effects of the Invention

According to the process of the present invention, the desired 3-dimensional structure can be formed without producing noise pattern, with high accuracy and high efficiency, and the 3-dimensional structure of various sizes and shapes can be produced by focusing effect through controlling charge and voltage. Accordingly, it is expected to be useful for producing future nanoparticle-based devices, such as plasmon sensor, solar cell and the like.

BRIEF DESCRIPTION OF DRAWINGS

The above and other objects and features of the present invention will become apparent from the following description of the invention taken in conjunction with the following accompanying drawings which respectively show.

DETAILED DESCRIPTION OF THE INVENTION

Hereinafter, the present invention will be described in further detail with reference to accompanying drawings.

Figure 1:
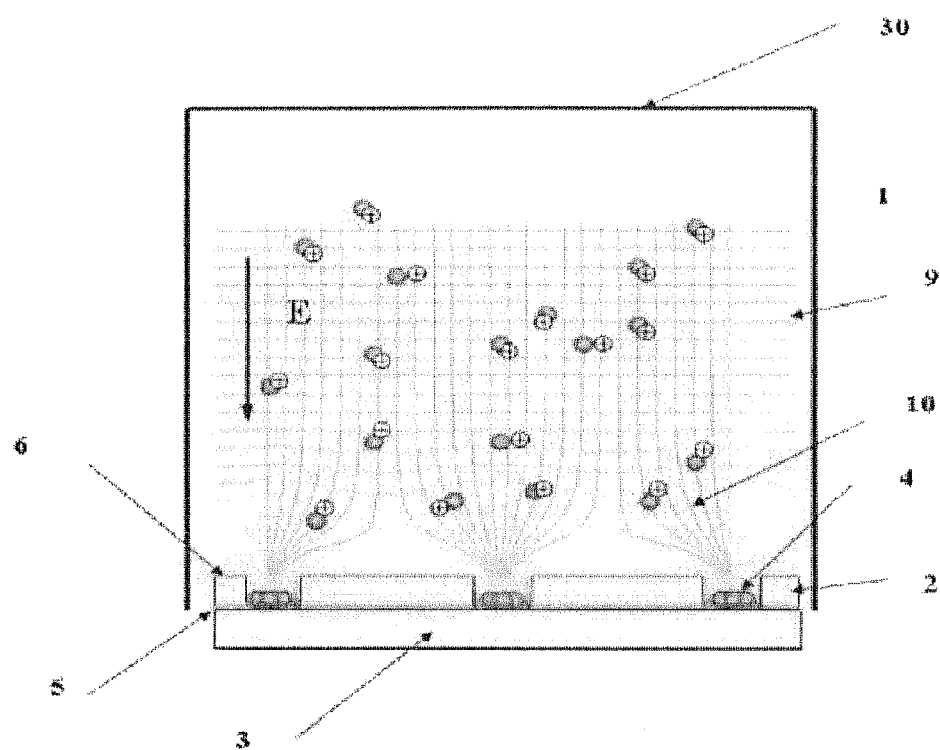
FIG. 1: a schematic diagram showing a patterning process according to prior art.
Figure 2:
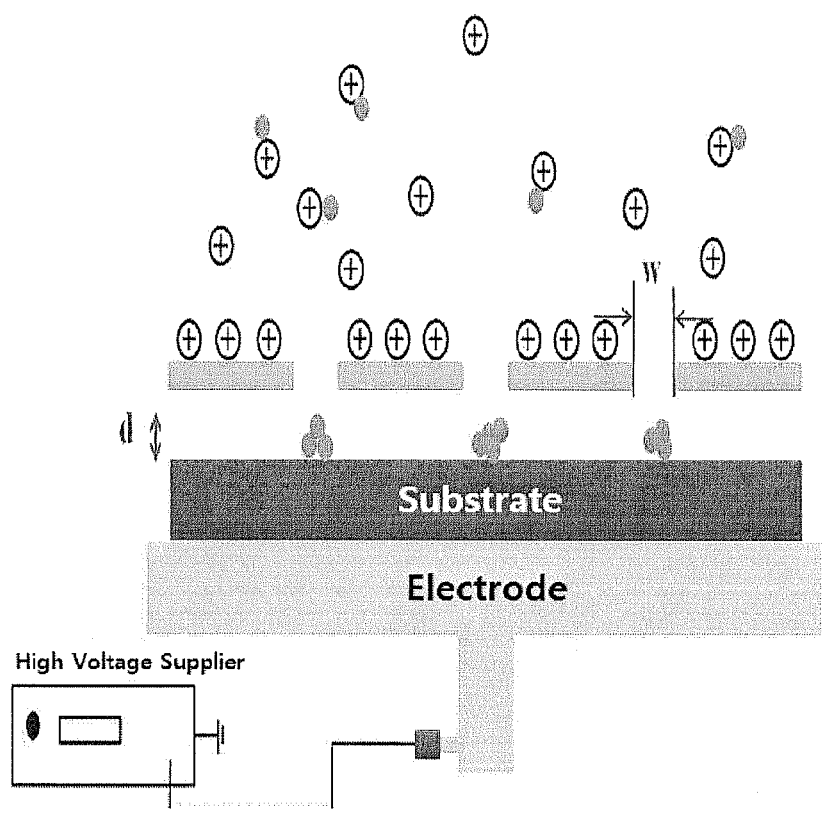
FIG. 2: a schematic diagram showing a process assembling a 3-dimensional structure of nanoparticles on a substrate according to one embodiment of the present invention.

FIG. 2 is a schematic diagram showing a process for producing a structure assembled from charged nanoparticles according to the present invention. In forming a 3-dimensional structure assembled from charged nanoparticles by generating an electric field in a reactor, the process of the present invention is characterized by: placing a mask having a pattern of openings or perforations of certain width w at a certain distance d above a substrate to be patterned; and then forming an electrodynamic focusing lens by applying voltage to the substrate, thereby inducing a 3-dimensional assembly of nanostructure. According to the process of the present invention described above, focusing level of the charged particles may be changed by direct control of charge and voltage. Accordingly, it is possible to form 3-dimensional nanostructures with various shape and size, ranging from nano- to micro-sized structures.

Figure 3:
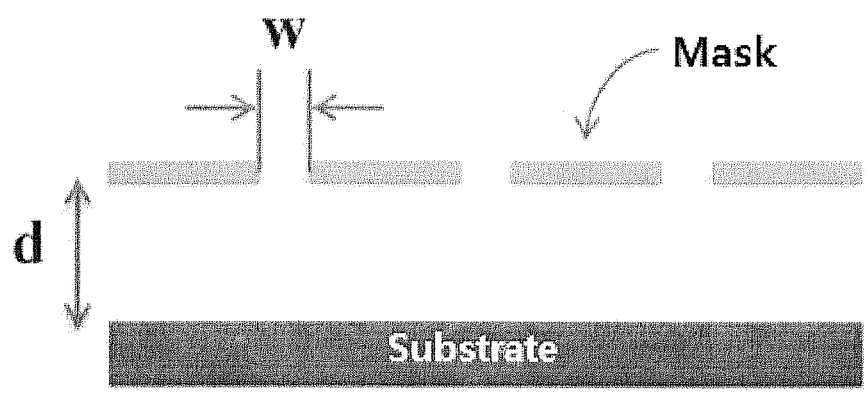
FIG. 3: a schematic diagram showing a mask having a pattern of perforations corresponding to a determined pattern at a certain distance above a substrate to be patterned and indicating the width of the perforations.

In the process of the present invention as illustrated in FIG. 2, an electrodynamic focusing lens is formed by: placing a substrate on an electrode in a grounded reactor, placing a mask having a pattern of perforations (width: w) preferably having an electrode or ion layer on one or both sides at a certain distance d above the substrate, and then applying voltage to the substrate (see FIG. 3).

The distance d between the substrate and the mask may be variously controlled depending on size of the perforations on the mask, voltage and the like. For example, when the width of the perforations on the mask is 0.5~50 μm, the distance d between the substrate and the mask may be 0.005~500 μm, more preferably 1~50 μm.

The mask having a pattern of perforations used in the present invention may be anything commonly used in the art, but not limited thereto. As an example, the prior patent of the present inventors, Korean Patent Registration No. 10-0907787, may be referred.

Further, in the present invention, an ion layer may be formed by introducing charged gas ions, which are charged with the same polarity as that of charged particles to be implanted, onto the mask surface. At this time, the thickness of the ion layer to be formed may be properly decided, considering thickness of the mask, voltage applied to the mask, and the chamber. The charged gas ion may be prepared by applying voltage, for example, in a range of 1 to 10 kV to gas by using an ion supplying device such as corona discharge generator. The charged gas ions include, for example, nitrogen ion ($N^{2+}$, $N^{2-}$), helium ion ($He^+$, $He^-$) and argon ion ($Ar^+$, $Ar^-$) and the like, but not limited thereto.

In applying voltage after placing the mask having a pattern of perforations at a certain distance above the substrate, for example, when the substrate is nonconductive, the mask may have electrode layers on both sides, and voltage may be applied to each of the both electrode layers; or when the substrate is conductive or semiconductive, the mask may have an ion layer on one side, the other side of the mask being contacted to the substrate, and voltage may be applied to the substrate, by applying voltage, an electrical field is formed inside of the reactor, i.e., around the substrate and the mask, and thereby the electrodynamic focusing lens is formed. The intensity of the applied voltage may be properly selected depending on the mask size, and the size and density of the charged particles, etc.

The charged particles may be introduced into the reactor by using common methods. For example, the particles may be charged in advance and then introduced by using a carrier gas; or the particles may be introduced while being charged by an electrospray.

The charged particles used in the present invention may be produced according to a common method. For example, unipolar charged spherical particles may be extracted by converting a source material (e.g.: Ag) to polydisperse particles through evaporation and condensation methods, and making the particles to bipolar charge state by Boltzmann distribution by using a radioactive material (e.g.: 210-polonium) followed by passing through a differential mobility analyzer (DMA).

The material for producing the 3-dimensional nanostructure according to the present invention may be a conductive material selected from gold, copper, tin, indium, ITO, graphite and silver; a conductive material coated with a nonconductive material selected from cadmium oxide, iron oxide and tin oxide; or a semiconductive material selected from silicon, GaAs and CdSe, but not limited thereto.

Figure 4:
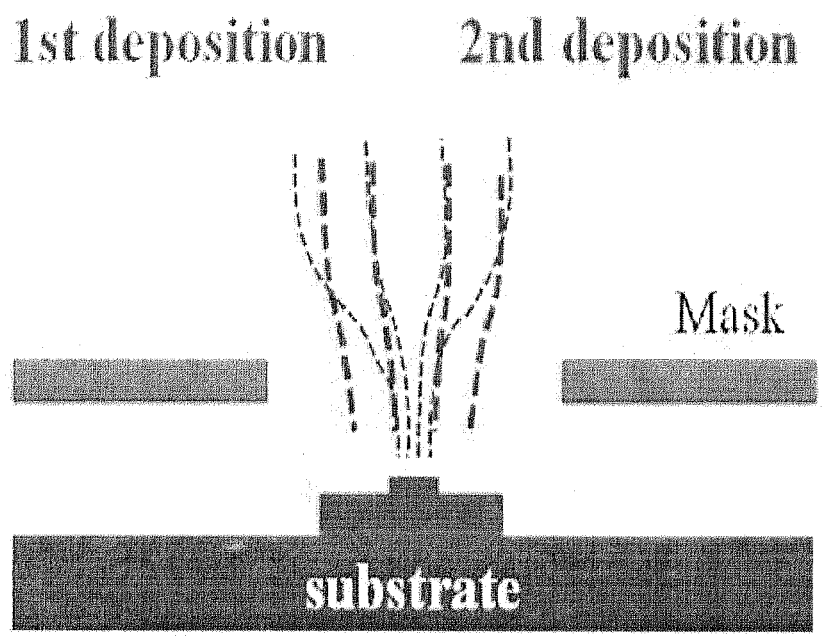
FIG. 4: a schematic diagram for explaining the principle of the first deposition and the second deposition according to voltage change.

Further, according to another embodiment of the present invention, the shape of the 3-dimensional structure may be variously changed by changing the voltage applied during the deposition reaction. In this case, as depicted in FIG. 4, the first deposition is performed while applying a first voltage and the second deposition is carried out while applying a second voltage, and thereby structural change may occur. For example, a 3-dimensional shape structure having core-shell structure may be easily formed.

Figure 5:
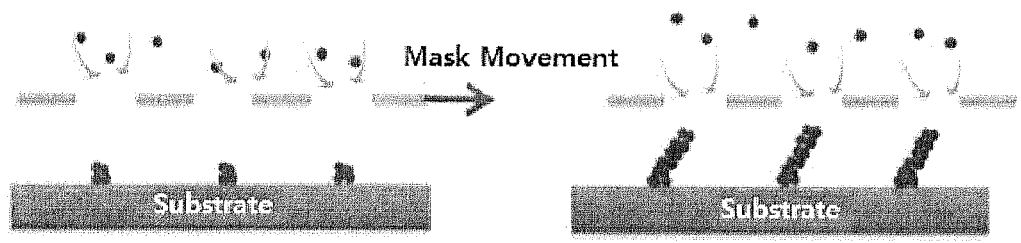
FIG. 5: a schematic diagram showing a process accumulating nanoparticles according to another embodiment of the present invention.

FIG. 5 shows a process accumulating nanoparticles while moving the mask according to another embodiment of the present invention. Because the nanoparticles are deposited along the moving path of the mask, a slanted-type 3-dimensional structure can be formed. Moving speed of the mask may be 0.01~10 μm/hr, preferably.

Hereinafter, the present invention will be described in further detail with reference to examples, and the scope of the present invention cannot be limited thereto in any way.

Example 1

As illustrated in FIG. 2, a silicon wafer was installed on an electrode in a reactor.

A mask having a pattern of perforations (silicon nitride, $SiN_2$) with stripe and dot pattern having a width of 4 μm was prepared. Distance between the substrate and the mask was 8 μm.

Figure 6:
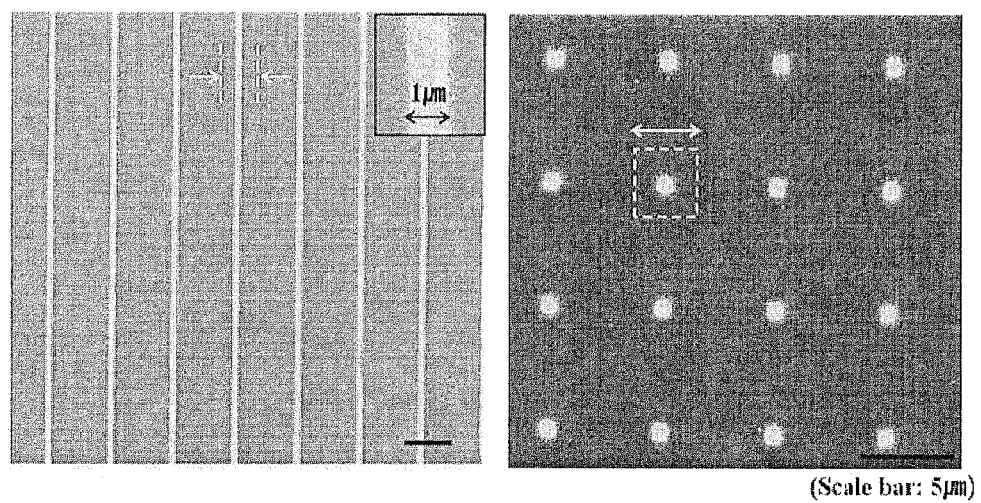
FIG. 6: an SEM image showing the deposition pattern according to Example 1.

Then, ions were produced by a common method of passing nitrogen gas through a corona discharge generator (voltage: 5 kV). Copper nanoparticles were produced by using a common spark discharge. Ions were accumulated on the substrate for 20 min with ion-accumulation voltage of −3 kV, and then, the nanoparticles were deposited on the substrate by applying deposition voltage of −1.5 kV for 60 min. Consequently, as shown in the image of FIG. 6, line pattern and dot pattern having a width of about 1 μm, which was much smaller than the width of the perforations of the mask, were formed.

Example 2

Figure 7:
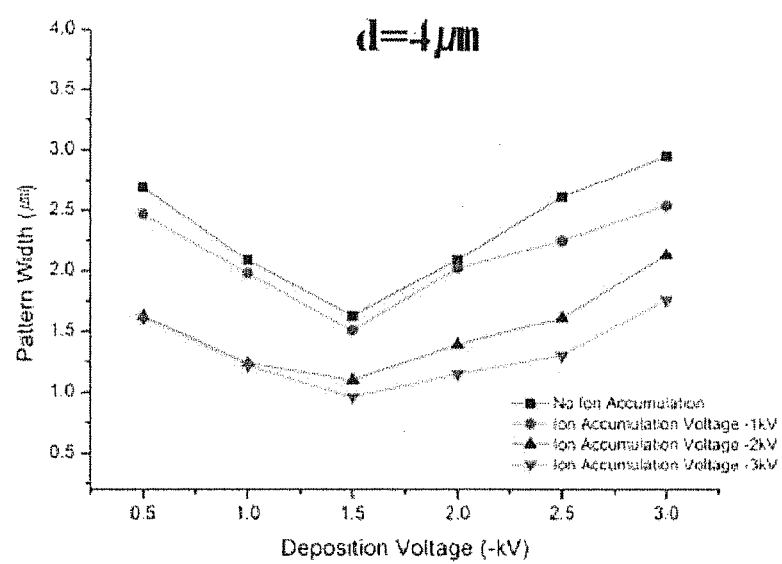
FIGS. 7 to 9: experimental results of Examples 2 and 3, and Comparative Example.

While the procedure of Example 1 was repeated in the same way, except for setting the distance d between the substrate and the mask (pattern of stripe perforations) to 4 μm, and except for changing the ion-accumulation voltage and the deposition voltage, the pattern width change was observed. The result is shown in FIG. 7.

Example 3

The procedure of Example 2 was repeated in the same way except for setting the distance between the substrate and the mask to 8 μm. The result is shown in FIG. 8.

Comparative Example

The procedure of Example 2 was repeated in the same way except for setting the distance between the substrate and the mask to 0 μm. The result is shown in FIG. 9.

Figure 8:
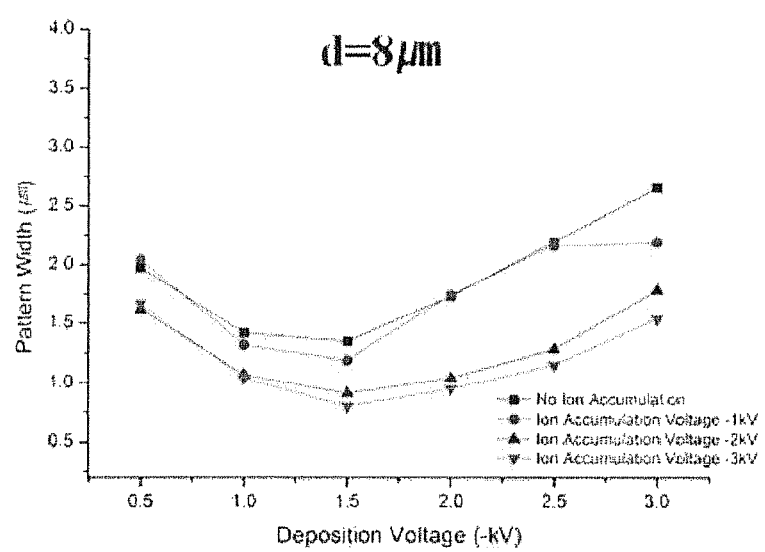
Figure 9:
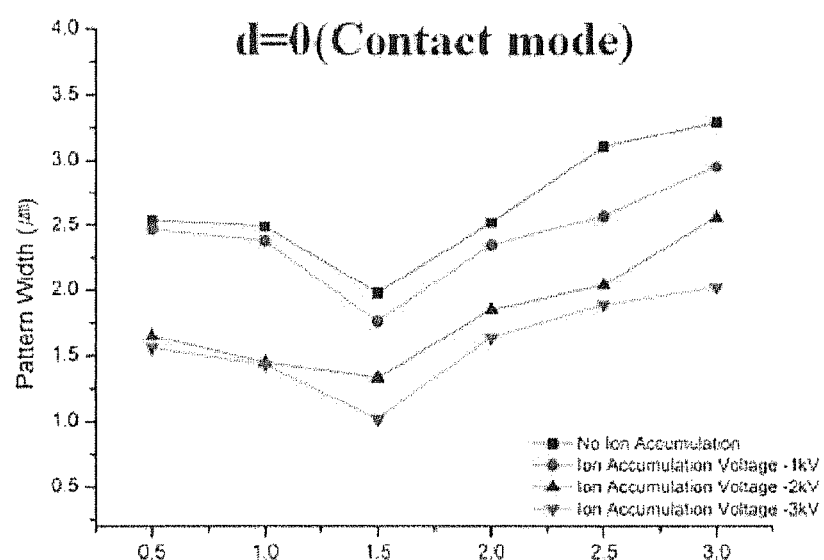

From the results of FIG. 7 to FIG. 9, it could be confirmed that the pattern width decreases as the distance between the mask and the substrate increases.

Example 4

Figure 10:
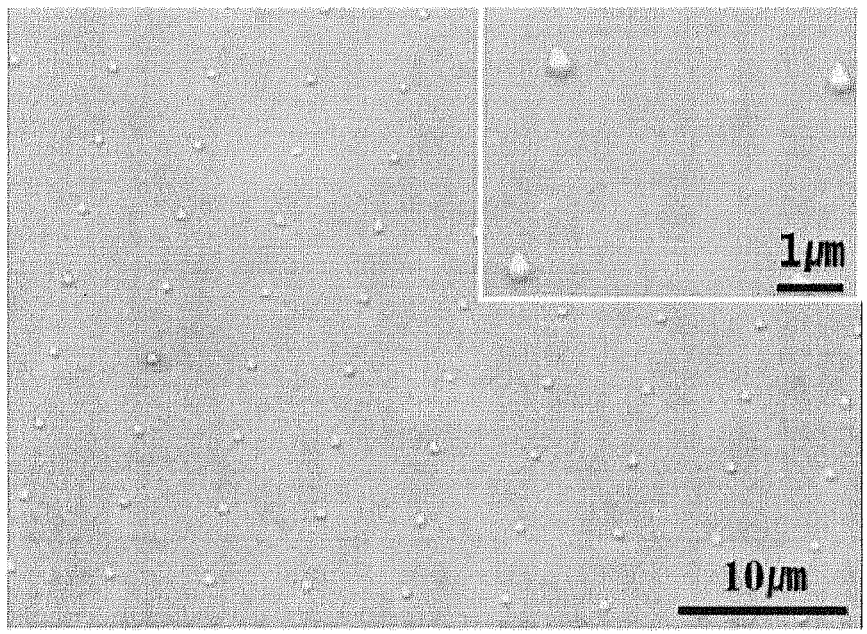
FIGS. 10 to 12: SEM images showing deposition pattern change depending on deposition time in Example 4.
Figure 11:
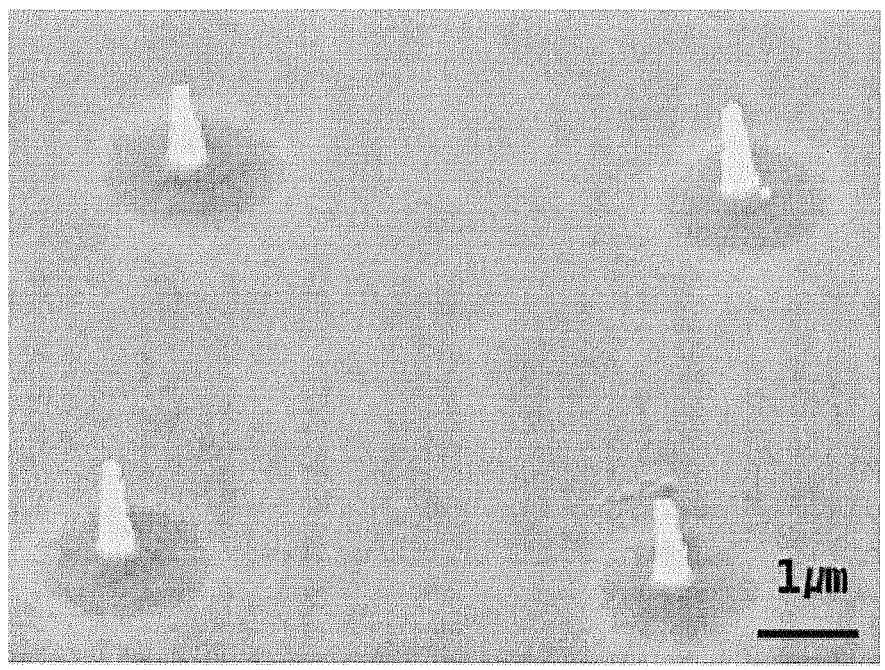
Figure 12:
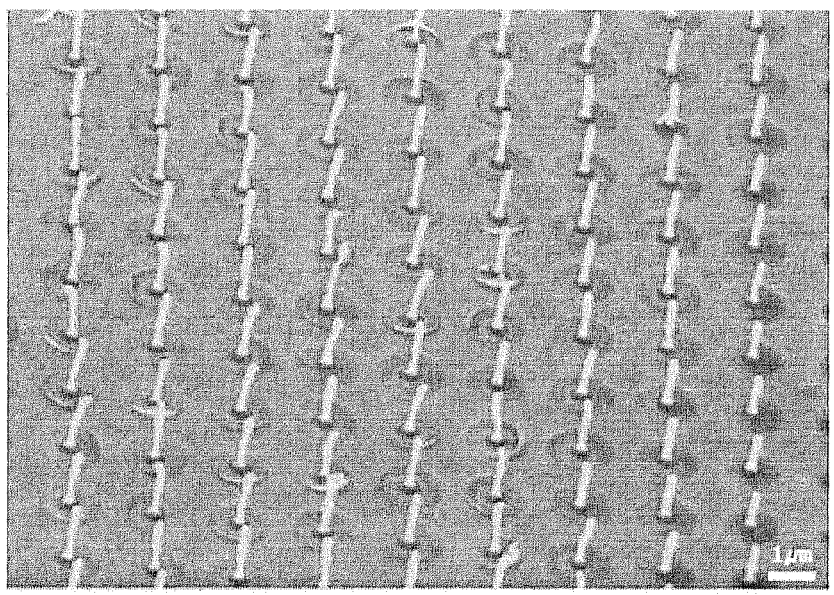

The procedure of Example 1 was repeated in the same way except for spacing the mask having dot pattern perforations (width: 2 μm) from the substrate with the distance of 4 μm and setting the ion-accumulation voltage and the deposition voltage to −3 kV and −1.5 kV, respectively. The results of depositions for 20 min, 40 min and 1 hour were shown in FIG. 10, FIG. 11 and FIG. 12, respectively. As deposition time increases, according to FIG. 10 to FIG. 12, it could be found that a nano-hair structure having diameter of about 0.2 μm was formed.

Example 5

Figure 13:
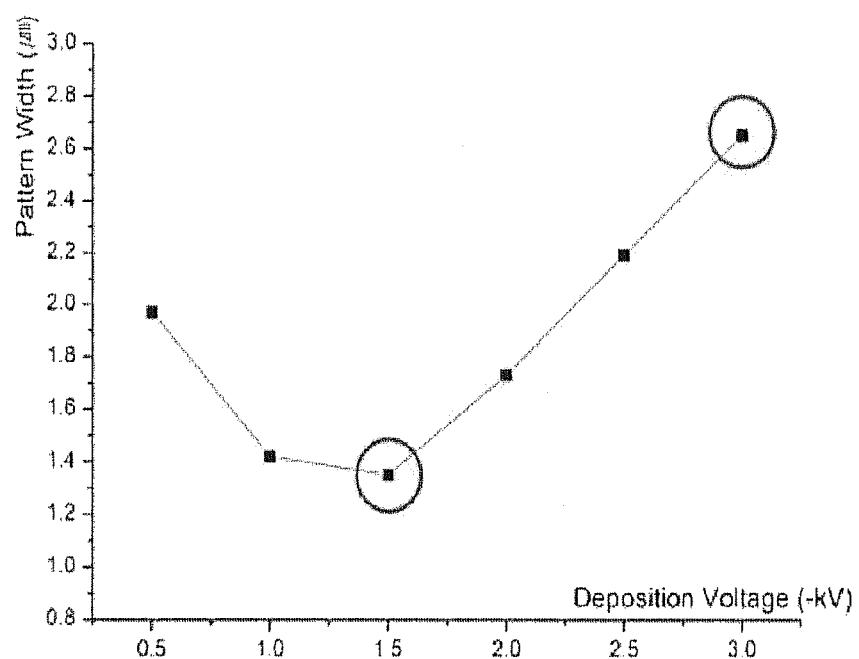
FIGS. 13 to 15: SEM images showing change in structure shape depending on voltage change in Example 5.
Figure 14:
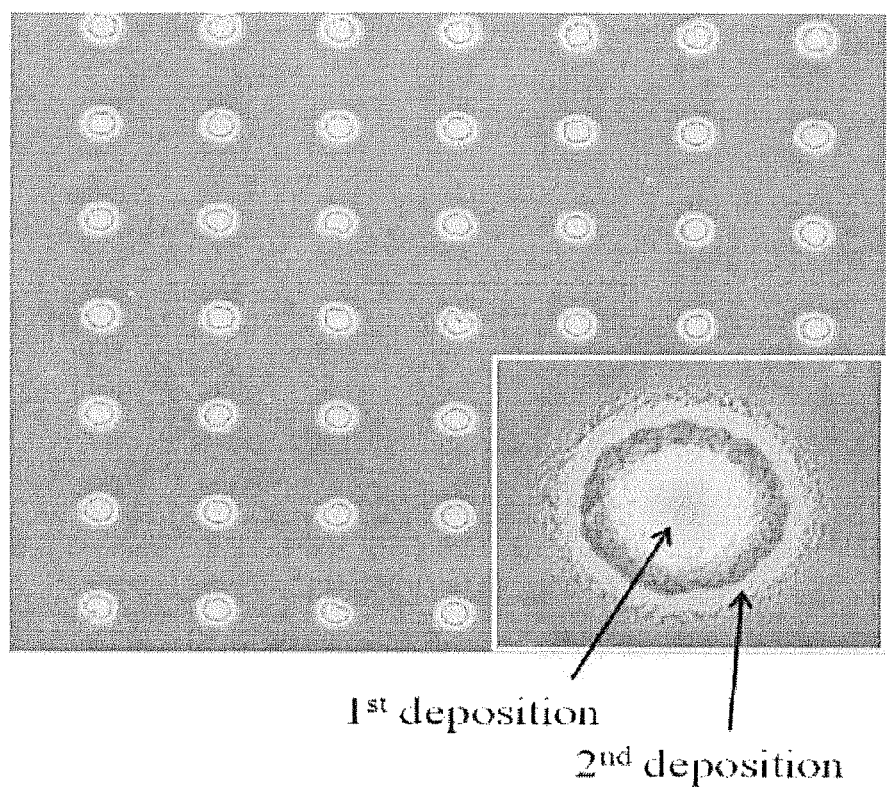
Figure 15:
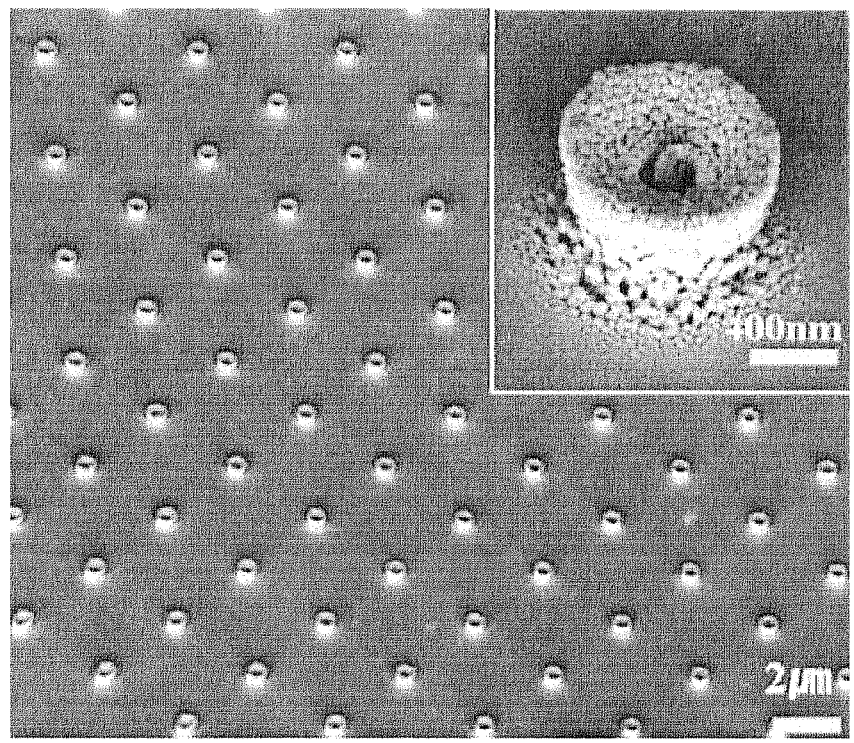

The procedure of Example 4 was repeated in the same way except for conducting the first deposition for 60 min at −1.5 kV and the second deposition for 60 min at −3.0 kV so as to obtain a core-shell type 3-dimensional structure (see FIGS. 13 to 15).

What is claimed is:

1. A process for producing a structure assembled from nanoparticles comprising the steps of:
   (i) in a grounded reactor, placing a mask having a pattern of perforations with a width (w) corresponding to a predetermined pattern at a certain distance (d) above a substrate to be patterned, with the mask being nonconductive and having an electrode or ion layer on one or both sides, and then applying voltage to the substrate or the mask to form an electrodynamic focusing lens; and
   (ii) introducing charged nanoparticles into the reactor, with the charged particles guided to the substrate through the pattern of perforations so as to be focused and attached to the substrate wherein the shape of 3-dimensional structures is changed by changing focusing level of the charged particles through controlling the charge or voltage by using a voltage and current supplying device, a battery or a storage battery.

2. The process for producing a structure assembled from nanoparticles according to claim 1, wherein the mask has an ion layer and the process further comprising a step of accumulating the ion layer by introducing charged gas ions, which are charged with the same polarity as that of charged nanoparticles, onto the mask surface.

3. The process for producing a structure assembled from nanoparticles according to claim 2, wherein, in the step of accumulating the ion layer, a voltage in a range of 0.01~10 kV, having opposite polarity to the charged particles is applied to the substrate.

4. The process for producing a structure assembled from nanoparticles according to claim 1, wherein, in the step of depositing the nanoparticles of the step (ii), a voltage, in a range of 0.01~10 kV, having opposite polarity to the charged particles is applied to the substrate.

5. The process for producing a structure assembled from nanoparticles according to claim 1, wherein the ratio of the width (w) of the perforations in the mask and the distance (d) between the substrate and the mask is in the range of 1:0.01~10.

6. The process for producing a structure assembled from nanoparticles according to claim 1, wherein the step (ii) comprises a first deposition at a first voltage and a second deposition at a second voltage, the first voltage and the second voltage being in the range of 0.01~10 kV having the opposite polarity to the charged particles, and the voltage intensities being different from each other.

7. The process for producing a structure assembled from nanoparticles according to claim 1, wherein, in the step of guiding the charged nanoparticles to the substrate through the pattern of perforations, the 3-dimensional structure formed by focused attachment of the charged nanoparticles is produced by focusing the charged nanoparticles while moving the mask or the substrate in a direction parallel or perpendicular to each other.

\* \* \* \* \*